(12) United States Patent
Kuljanishvili et al.

(10) Patent No.: US 10,752,794 B2
(45) Date of Patent: Aug. 25, 2020

(54) MASK FREE METHODS OF DEPOSITING COMPOSITIONS TO FORM HETEROSTRUCTURES

(71) Applicant: Saint Louis University, St. Louis, MO (US)

(72) Inventors: Irma Kuljanishvili, St. Louis, MO (US); Rui Dong, St. Louis, MO (US); Logan Moore, Festus, MO (US)

(73) Assignee: Saint Louis University, St. Louis, MO (US)

( * ) Notice: Subject to any disclaimer, the term of this patent is extended or adjusted under 35 U.S.C. 154(b) by 330 days.

(21) Appl. No.: 15/816,574

(22) Filed: Nov. 17, 2017

(65) Prior Publication Data
US 2018/0142109 A1 May 24, 2018

Related U.S. Application Data

(60) Provisional application No. 62/423,912, filed on Nov. 18, 2016.

(51) Int. Cl.
| | | |
|---|---|---|
| *C09D 11/037* | (2014.01) | |
| *C01B 19/04* | (2006.01) | |
| *C23C 14/22* | (2006.01) | |
| *C01G 39/06* | (2006.01) | |
| *C01G 41/00* | (2006.01) | |
| *C01G 39/00* | (2006.01) | |
| *C23C 16/30* | (2006.01) | |

(52) U.S. Cl.
CPC .......... *C09D 11/037* (2013.01); *C01B 19/04* (2013.01); *C01G 39/006* (2013.01); *C01G 39/06* (2013.01); *C01G 41/00* (2013.01); *C01G 41/006* (2013.01); *C23C 14/22* (2013.01); *C23C 16/30* (2013.01); *C01P 2002/72* (2013.01); *C01P 2002/82* (2013.01); *C01P 2004/04* (2013.01); *C01P 2004/62* (2013.01)

(58) Field of Classification Search
CPC ...... C09D 11/037; C01G 39/06; C01G 41/00; C01B 19/04; C23C 14/22; C01P 2004/62
See application file for complete search history.

(56) References Cited

U.S. PATENT DOCUMENTS

| | | |
|---|---|---|
| 5,691,541 A | 11/1997 | Ceglio et al. |
| 9,372,397 B2 | 6/2016 | Mirkin et al. |
| 2011/0033632 A1 | 2/2011 | Vance et al. |

OTHER PUBLICATIONS

Rui Dong, Logan Moore, Nozima Aripova, Christopher Williamson, Robert Schurz, Yuzi Liu, Leonidas E. Ocola and Irma Kuljanishvili Bottom-up direct writing approach for controlled fabrication of WS2/MoS2 heterostructure systems,RSC Adv., 2016, 6, 66589-66594 | (Year: 2016).*

(Continued)

*Primary Examiner* — Bijan Ahvazi
(74) *Attorney, Agent, or Firm* — Parker Highlander PLLC

(57) ABSTRACT

The present disclosure provides methods of preparing heterostructures of two or more transition metal dichalcogenides on a surface in a pattern in which the method does not require a mask or blocking agent to create a pattern on the surface. Also provided herein are ink compositions which are used in the methods described herein and include precursor materials that generate these transition metal dichalcogenides.

19 Claims, 8 Drawing Sheets

(56) References Cited

OTHER PUBLICATIONS

Bhimanapati et al., "Recent Advances in Two-Dimensional Materials beyond Graphene," *ACS Nano*, 9:11509-11539, 2015.
Chen et al., "Electronic Properties of $MoS_2$—$WS_2$ Heterostructures Synthesized with Two-Step Lateral Epitaxial Strategy," *ACS Nano*, 9:9868-9876, 2015.
Dong et al., "Application of Scanning Probe Nanolithography to fabrication and study of large area graphene and Transition Metal Dichalcogenides heterostructures," Abstract ID: BAPS.2015.MAR. P1.324, *Am. Phys. Soc.*, 2015.
Gong et al., "Vertical and in-plane heterostructures from $WS_2/MoS_2$ monolayers," *Nat. Mater.*, 13:1135-1142, 2014.
Huo et al., "Interlayer coupling and optoelectronic properties of ultrathin two-dimensional heterostructures based on graphene, $MoS_2$ and $WS_2$," *J. Mater. Chem. C*, 3:5467-5473, 2015.
Huo et al., "Novel and Enhanced Optoelectronic Performances of Multilayer $MoS_2$—$WS_2$ Heterostructure Transistors," *Adv. Funct. Mater.*, 24:7025-7031, 2014.
Huo et al., "Photoresponsive and Gas Sensing Field-Effect Transistors based on Multilayer $WS_2$ Nanoflakes," *Sci. Rep.*, 4, 5209, 2014.
Jung et al., "Chemically Synthesized Heterostructures of Two-Dimensional Molybdenum/Tungsten-Based Dichalcogenides with Vertically Aligned Layers," *ACS Nano*, 8:9550-9557, 2014.
Kuljanishvili et al., "Controllable Patterning and CVD Growth of Isolated Carbon Nanotubes with Direct Parallel Writing of Catalyst Using Dip-Pen Nanolithography," *Small*, 5:2523-2527, 2009.
Li et al., "Controlled growth of long GaN nanowires from catalyst patterns fabricated by "dip-pen" nanolithographic techniques," *Chem. Mater.*, 16:1633-1636, 2004.
Li et al., "Electrochemical AFM "Dip-Pen" Nanolithography," *J. Am. Chem. Soc.*, 123(9):2105-2016, 2001.
Liu et al., "Growth of Large-Area and Highly Crystalline $MoS_2$ Thin Layers on Insulating Substrates," *Nano Lett.*, 12:1538-1544, 2012.
Piner et al., ""Dip-Pen" Nanolithography," *Science*, 283 (5402):661-663, 1999.
Rozhok et al., "Dip-pen nanolithography: What controls ink transport?" *J. Phys. Chem. B*, 107:751-757, 2003.
Tongay et al., "Tuning Interlayer Coupling in Large-Area Heterostructures with CVD-Grown $MoS_2$ and $WS_2$ Monolayers," *Nano Lett.*, 14:3185-3190, 2014.
Wu et al., "Direct deposition and assembly of gold colloidal particles using a nanofountain probe," *Langmuir*, 23:9120-9123, 2007.
Yu et al., "Equally Efficient Interlayer Exciton Relaxation and Improved Absorption in Epitaxial and Nonepitaxial $MoS_2/WS_2$ Heterostructures," *Nano Lett.*, 15:486-491, 2015.

\* cited by examiner

MASK FREE METHODS OF DEPOSITING COMPOSITIONS TO FORM HETEROSTRUCTURES

The present application claims the benefit of priority to U.S. Provisional Application No. 62/423,912, filed on Nov. 18, 2016, the entire contents of which are hereby incorporated by reference.

BACKGROUND

1. Field

The present disclosure relates generally to the field of nanomaterials. More particularly, it concerns methods of depositing compounds onto a surface using an ink composition which allows the formation of hetero structures.

2. Description of Related Art

In addition to studies of single layer $MX_2$ materials, van der Waals (vdW) heterostructures that consist of dissimilar $MX_2$ materials, arranged in a vertical direction, have recently been gaining extensive attention. In typical semiconductor heterostructures made of two or more dissimilar materials, highly matched crystalline lattices are required to yield high quality interfaces, hence the designs for multi-compositional conventional semiconductors is complex. In the $MX_2$ heterostructures however, high quality interfaces can be achieved even in the mismatched systems (Yu et al., 2015). That is due to the nature of the weak vdW forces that are governing the interactions in layered $MX_2$ materials (Yu et al., 2015). Novel properties/phenomena that have been revealed in $MX_2$ heterostructures could trigger a revolution in the design of heterostructure systems for applications such as photovoltaics, optoelectronics, and spontaneous water splitting (Jung et al., 2014 and Tongay et al., 2014).

Several approaches have been developed to prepare $MX_2$ layers such as micromechanical exfoliation, chemical/electrochemical exfoliation, and chemical vapour deposition (CVD). To date, fabrication of $MX_2$ heterostructures are mainly based on the combination of exfoliation and CVD methods Huo et al. (2014) and Huo et al., (2015) micromechanically exfoliated $MoS_2$ and $WS_2$ flakes, and demonstrated the transfer of $WS_2$ layer onto $MoS_2$ flakes using polymethyl methacrylate (PMMA) coating and sodium hydroxide (NaOH) solution etching methods. Bhimanapati et al., (2015) prepared $MoS_2$ and $WS_2$ layer using CVD methods then lifted off and transferred the synthesized $MoS_2$ onto as-grown $WS_2$ layer manually. Chen et al. (2015) fabricated $MoS_2$ by CVD method, and $WS_2$ layer was obtained by the thermolysis of ammonium tungstate hydrate in an inert gas environment. Zhang et al. (2015) synthesized $MoS_2/WS_2$ heterostructures using core-shell $WO_{3-x}/MoO_{3-x}$ nanowires as precursors. Jung et al. (2014) deposited and patterned tungsten/molybdenum (W/Mo) and then introduced sulfur (S) vapor for the growth of heterostructure. Gong et al. (2014) fabricated vertically stacked and in-plane (lateral) $WS_2/MoS_2$ heterostructures by controlling the CVD growth temperature and using sulphur, tungsten, and molybdenum oxide as precursors. Although exciting properties have been discovered in these heterostructure systems fabricated with different processing methods, it is challenging to control the shapes, geometry and precise positions of $MX_2$ heterostructure formations at preselected locations. In order to control the position of $MoS_2$ and $WS_2$ layers, additional photo/e-beam lithography is usually required, which inevitably introduces organic/polymer residues and may introduce strain to the interface between the layers and thus could degrade the heterostructure interface quality. Therefore, there remains a strong desire to develop new methods which allow the production of metal dichalcogenides ($MX_2$) heterostructures.

SUMMARY

In some aspects, the present disclosure describes ink precursor compositions for use in the deposition of metal dichalcogenides onto a surface. Also, described herein are methods of depositing metal dichalcogenides onto a surface in nano- or micro-features without the use of masks or other blocking agents.

In one aspect, the present disclosure provides ink compositions comprising:
(A) a metal salt of the formula: $X_2ML_2$, wherein:
   X is a monovalent cation;
   M is a transition metal; and
   L is a divalent chalcogen ligand; and
(B) deionized water;
wherein the ink composition is substantially free of particles greater than 0.2 µm.

In some embodiments, the metal salt is homogenously dispersed in the deionized water. In some embodiments, X is a quaternary ammonium such as $NH_4$. In some embodiments, M is hexavalent transition metal such as a transition metal of Group 6. In some embodiments, M is tungsten(VI) or molybdenum(VI). In some embodiments, L is sulfide or selenide. In some embodiments, L is sulfide. In some embodiments, the metal salt is $(NH_4)_2MoS_4$ or $(NH_4)_2WS_4$.

In still another aspect, the present disclosure provides ink compositions of the formula:
(A) a metal salt of the formula: $Y_aZ_b$, wherein:
   Y is a monovalent cation;
   Z is a transition metal oxide of Group 6; and
   a and b are each independently integers sufficient to balance the charge of the transition metal ion of Group 6; and
(B) deionized water;
wherein the ink composition is substantially free of particles greater than 0.2 µm and the composition is formulated for use in deposition process.

In some embodiments, the metal salt is homogenously dispersed in the deionized water. In some embodiments, Y is a quaternary ammonium such as $NH_4$. In other embodiments, Y is a proton. In other embodiments, Y is a mixture of two or more monovalent cations. In some embodiments, M is a transition metal oxide of Group 6 is of the formula:

$$(M_1)_x(L_1)_y^{z+}$$

wherein:
   $M_1$ is a transition metal of Group 6;
   $L_1$ is an oxide ligand;
   x is 2, 3, 4, 5, 6, 7, 8, 9, or 10;
   y is 3-24; and
   z is the resultant charge of the formula.

In some embodiments, $M_1$ is a molybdenum or tungsten ion. In some embodiments, M is $W_2O_7$ or $Mo_7O_{24}$. In some embodiments, the metal salt is $(NH_4)_6Mo_7O_{24}$ or $(NH_4)_{10}H_2(W_2O_7)_6$ such as $(NH_4)_6Mo_7O_{24}4H_2O$.

In still another aspect, the present disclosure provides methods of preparing a heterostructure comprising:
(A) applying a first ink composition described herein comprising a first metal salt to a substrate;

(B) heating the substrate to a first temperature to crystallize the first ink composition to obtain a first metal dichalcogenide;
(C) applying a second ink composition comprising a second metal salt, wherein the second metal salt is different from the first metal salt; and
(D) heating the substrate to a second temperature to crystallize the second ink composition to obtain a second metal dichalcogenide,
wherein the first ink composition is different from the second ink composition.

In some embodiments, the first ink composition is applied in a pattern. The pattern of the first ink composition may be maintained after the formation of the first metal dichalcogenide. In other embodiments, the second ink composition is applied in a pattern. The pattern of the second ink composition may be maintained after the formation of the second metal dichalcogenide. In some embodiments, the pattern is an array of dots, an array of ribbons or lines, an array of zig-zag or another meandering shaped line or pattern, a lateral nanostructure assemblies of dots and/or ribbons or lines, a vertical structure assemblies made up of dots and/or ribbons or lines, or a complex geometric shape comprises of lines and/or dots. In some embodiments, the first ink composition is patterned over the top of the second ink composition. The methods may further comprise applying one or more additional ink compositions to the substrate and heating the substrate to one or more additional temperatures to crystallize the one or more additional ink composition to obtain a one or more additional metal dichalcogenide.

The methods may comprise one, two, three, or four additional ink compositions. In some embodiments, the methods comprise one or two additional ink compositions. The methods may comprise one additional ink composition.

In some embodiments, the methods comprise applying the ink composition such that the first ink composition is located closest to the substrate and each subsequent ink composition is partially or fully applied on top of the proceeding metal dichalcogenide resulting from the proceeding ink composition.

In some embodiments, the first ink composition comprises a first metal salt selected from a $(NH_4)_2MoS_4$, $(NH_4)_2MoSe_4$, $(NH_4)_2WS_4$, and $(NH_4)_2WSe_4$. The first temperature may be from about 275° C. to about 1200° C., from about 350° C. to about 1000° C., or from about 400° C. to about 800° C. In some embodiments, the first temperature is about 450° C. The substrate may be heated at the first temperature in the presence of hydrogen gas. In some embodiments, the first metal dichalcogenide is $WS_2$, $MoS_2$, $WSe_2$, or $MoSe_2$.

In some embodiments, the second ink composition comprises a second metal salt selected from a $(NH_4)_2MoS_4$, $(NH_4)_2MoSe_4$, $(NH_4)_2WS_4$, and $(NH_4)_2WSe_4$. The second temperature may be from about 275° C. to about 1250° C., from about 300° C. to about 1000° C., or from about 350° C. to about 800° C. In some embodiments, the second temperature is about 400° C. In some embodiments, the substrate is heated at the second temperature in the presence of hydrogen gas. The second metal dichalcogenide may be $WS_2$, $MoS_2$, $WSe_2$, or $MoSe_2$.

The substrate may be a silica and/or silicon dioxide surface. Alternatively, the substrate may be a graphene surface. In some embodiments, the substrate is a silicon nitride, quartz, sapphire, or polyimide surface.

In some embodiments, the methods further comprise adding a chalcogen selected from sulfur and selenium while the heating the substrate to either the first temperature or the second temperature. The chalcogen may be added at both the first temperature and the second temperature. In some embodiments, the first temperature is about 600° C. when a chalcogen is present. In some embodiments, the second temperature is about 600° C. when a chalcogen is present. The chalcogen may added as a solid. In one embodiment, the chalcogen is added when either the first or second metal salt is an oxide. In some embodiments, the chalcogen is added when both the first and second metal salts are oxides.

In some embodiments, the ink composition is applied at room temperature. Alternatively, the ink composition may be applied at ambient pressure. In some embodiments, the ink composition is applied using a pen cantilever such as with a single pen cantilever or a multi-pen cantilever. In some embodiments, the ink composition is applied using a method comprising:
(A) placing the pen of the pen cantilever into the ink composition such that some of the ink composition is transferred to the pen;
(B) placing the pen over the location on the substrate to which the ink composition is to be deposited; and
(C) contacting the ink composition on the pen with the substrate such that at least some of the ink composition on the pen is transferred to the substrate.
In some embodiments, all of the ink composition on the pen is transferred to the substrate.

In some embodiments, the first metal dichalcogenide forms a feature with a width from about 0.25 μm to about 10 μm, from about 0.5 μm to about 5 μm, or from about 0.6 μm to about 3.2 μm. The second metal dichalcogenide may form a feature with a width from about 0.25 μm to about 10 μm, from about 0.5 μm to about 5 μm, or from about 0.6 μm to about 3.2 μm. Similarly, the first metal dichalcogenide may form a feature with a thickness from about 0.1 nm to about 1 μm or from about 0.5 nm to about 250 nm. In some embodiments, the second metal dichalcogenide forms a feature with a thickness from about 0.1 nm to about 0.5 μm or from about 1 nm to about 250 nm.

In some aspects, the present disclosure provides articles of manufacture comprising a heterostructure prepared using the ink composition or methods described herein. The article may be an electronic device such as a transistor. Alternatively, the article may be an optical device such as an emitter or a detector.

As used herein the specification, "a" or "an" may mean one or more. As used herein in the claim(s), when used in conjunction with the word "comprising", the words "a" or "an" may mean one or more than one.

The use of the term "or" in the claims is used to mean "and/or" unless explicitly indicated to refer to alternatives only or the alternatives are mutually exclusive, although the disclosure supports a definition that refers to only alternatives and "and/or." As used herein "another" may mean at least a second or more.

The term "chalcogen" or "chalcogenide" is an atom selected from either sulfur or selenium. The term chalcogenide generally references to the divalent ligand and chalcogen refers to the atom. Both of these terms though may be used interchangeably.

Throughout this application, the term "about" is used to indicate that a value includes the inherent variation of error for the device, the method being employed to determine the value, or the variation that exists among the study subjects.

The term "quaternary ammonium" is used to describe any tetra-substituted nitrogen atom which bears a positive charge. The term includes ammonium ($NH_4$) as well as other tetrasubstiuted nitrogen atoms such as tetramethylammonium (choline), tetraethylammonium, or tetraphenylammonium.

Other objects, features and advantages of the present disclosure will become apparent from the following detailed description. It should be understood, however, that the detailed description and the specific examples, while indicating preferred embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The following drawings form part of the present specification and are included to further demonstrate certain aspects of the present disclosure. The disclosure may be better understood by reference to one or more of these drawings in combination with the detailed description of specific embodiments presented herein.

(FIG. 1A) $(NH_4)_2MoS_4$ precursor ink was deposited in the form of ribbon arrays on $SiO_2/Si$ substrate and then patterns are subsequently processed in the CVD furnace to crystalize into $MoS_2$; (FIG. 1B) $(NH_4)_2WS_4$ precursor ink was deposited atop of the $MoS_2$ ribbons to obtain vertical bilayer heterostructures; c) and d) show lateral heterostructures; (FIG. 1C) $(NH_4)_2WS_4$ precursor ink is shown to be deposited adjacent to the $MoS_2$ to obtain $WS_2/MoS_2$ lateral bilayer heterostructures; (FIG. 1D) Example of $MoS_2/WS_2/MoS_2$ lateral tri-layer heterostructures assembly is shown.

(FIG. 2A) Step 1, the "inking" process as denoted in optical view where 12 tips are shown in the picture dipped into individual ink channels; (FIG. 2B) Step 2, the "writing" process as denoted in optical view where a selected area is indicated with pre-patterned alphabetical markers and electrodes, (only 4 pens are shown in the picture touching the surface, distance between numerical markers is approximately 55 µm).

(FIG. 3A) AFM topography image of the $WS_2$ dots array (3×3) and (FIG. 3B) AFM topography image of L-shaped $WS_2$ structure. Line profiles shown in (FIG. 3C) and (FIG. 3D) represent AFM height measurements of the selected locations marked by dotted line in AFM images in (FIG. 3A) and (FIG. 3B) respectively. $WS_2$ dot height and L-shaped ribbon height are approximately 60 nm and 110 nm respectively.

(FIG. 4A) the optical view of the array of $(NH_4)_2MoS_4$ precursor ribbons with selected width/thickness (~10 µm/~160 nm), prepared with multi-pen cantilevers; (FIG. 4B) the optical view of a single ribbon $(NH_4)_2WS_4$ written on pre-selected location crossing three parallel ribbons; (FIG. 4C) the AFM image of $WS_2$ ribbons written by controlling the tip moving speed (left: 5 µm/s, right: 2 µm/s), a line profile is also included and shows proportionally increased width of the ribbons with decreased speed of writing; (FIG. 4D) the AFM image of the $WS_2$ ribbon were obtained with the controlled ink concentration and a line profile shows thickness of the ribbon to be 1.6 nm, which is approximately equivalent to double layer $WS_2$ structure. Average width of the ribbon in (FIG. 4D) is approximately 700 nm.

(FIG. 5A) AFM images of the $WS_2$ ribbon structures formed between the prefabricated Al/Ti electrodes on $SiO_2/Si$ substrate; (FIG. 5B) enlargement of AFM images of connection between Al/Ti electrodes and $WS_2$ ribbon; (FIG. 5C) enlargement of AFM images and the height profile measurement (inset); (FIG. 5D) AFM 3D image of the area shown in (FIG. 5A); (FIG. 5E), Transport measurement of $WS_2$ ribbon fabricated by direct write technique atop of metal electrodes (inset: AFM images of the measured device; a horizontal ribbon of $WS_2$ between two electrode is shown, the scale bar is 5 µm). (FIG. 5F) High-resolution TEM image for the $MoS_2$ polycrystalline film (see Example 3 for more details).

(FIG. 6A) The production scheme for the arrays of $WS_2/MoS_2$ bilayer vertical heterostructures; (FIG. 6B) Optical image of $WS_2/MoS_2$ bilayer vertical heterostructures; (FIG. 6C) Representative AFM 3D image of patterned cross-bar $WS_2/MoS_2$ vertical heterostructures, (see more details in Example 3 in FIG. 7); (FIG. 6D) The Production scheme for the arrays of $WS_2/MoS_2$ bilayer lateral heterostructures; (FIG. 6E) Optical image of $WS_2/MoS_2$ bilayer lateral heterostructures; (FIG. 6F) Representative Resonant Raman spectroscopy of the fabricated ribbons of $MoS_2$, $WS_2$ and $WS_2/MoS_2$ vertical heterostructures.

(FIG. 7A) AFM topography image of $WS_2/MoS_2$ heterostructure formed on $SiO_2/Si$, three dotted lines mark locations of height line profiles, (FIG. 7B) line profile of $MoS_2$ ribbon patterned in x-axis direction, (FIG. 7C) line profile of $WS_2$ ribbon patterned in y-axis direction, and (FIG. 7D) line profile of the heterostructure cross-bar region. Height measurement in (FIG. 7D) indicate the combined thickness of two materials at the cross bar region.

(FIG. 8A) the schematic representation of $MoS_2/WS_2/MoS_2$ tri-layer vertical heterostructure; (FIG. 8B) the optical view of the $MoS_2/WS_2/MoS_2$ tri-layer vertical heterostructures; (FIG. 8C) the schematic representation of $MoS_2/WS_2/MoS_2$ tri-layer lateral heterostructure; (FIG. 8D) the optical view of the $MoS_2/WS_2/MoS_2$ tri-layer lateral heterostructures. Yellow rectangular pads represent metal electrodes in FIG. 8A and FIG. 8C; also seen in optical images in FIG. 8B and FIG. 8D (scale bars are ~100 µm).

DESCRIPTION OF ILLUSTRATIVE EMBODIMENTS

Figures 1A, 1B, 1C, 1D:
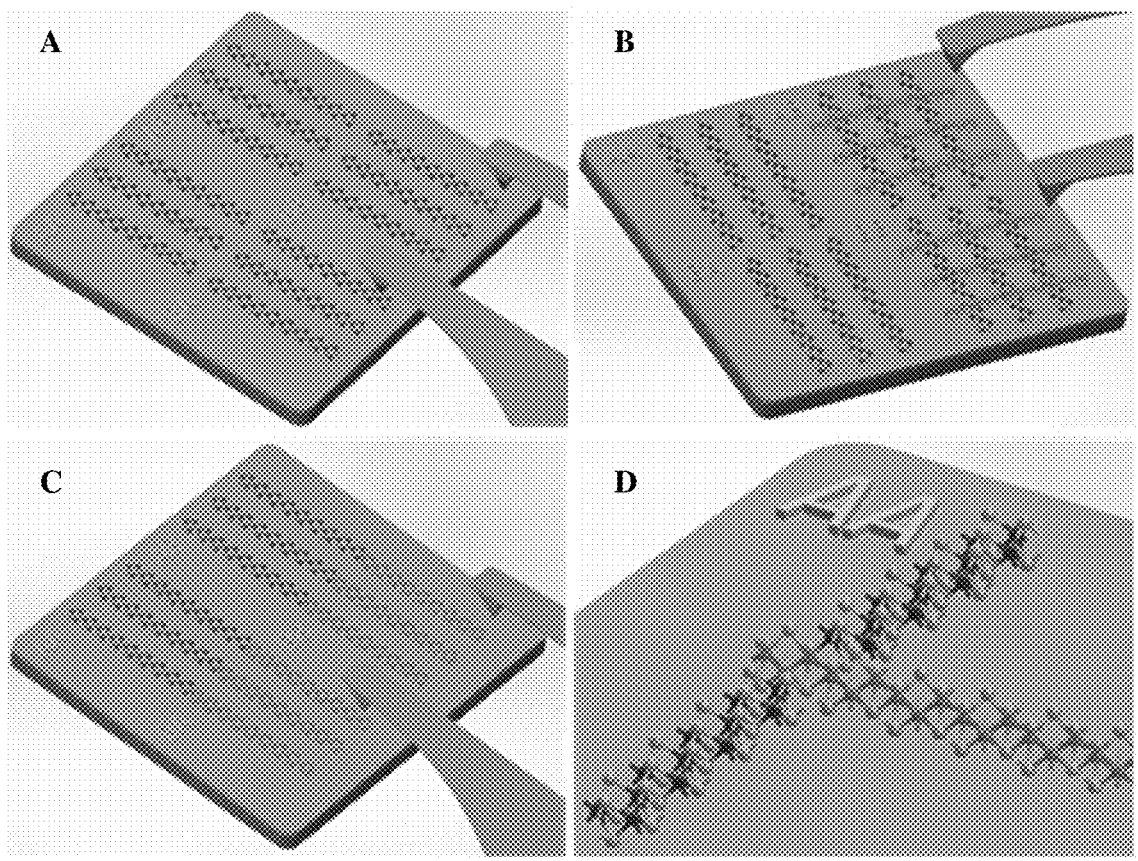
FIGS. 1A-1D show the schematic representation of the production process that show variety of geometric designs of $WS_2/MoS_2$ heterostructures.

The present disclosure provides methods of preparing heterostructures comprising two or more metal dichalcogenides from precursor ink composition on a surface. The methods described herein may comprise depositing an ink composition onto the surface, wherein the ink composition contains a metal dichalcogenide precursor and then heating the surface in the presence of hydrogen gas to obtain a first metal dichalcogenide feature. This process is then repeated with a second metal dichalcogenide precursor to obtain a second metal dichalcogenide feature. In some aspects, the features of the first metal dichalcogenide overlap the features of the second metal dichalcogenide, while, in other aspects, the two features are independent and do not overlap.

I. SURFACES

In some aspects, the metal dichalcogenides are deposited on a solid surface. The surface may be either a flexible or rigid surface. Some non-limiting examples of surfaces include silica, Si/SiO$_2$, silicon, graphene, a polymer, quartz, sapphire, or a nitride surface. The polymer surface may be a polyimide film. Additionally, the nitride is silicon nitride. Other examples of surfaces include those taught by Yu, et al., 2013 and Zhang, et al., 2013, which are both specifically incorporated herein by reference.

II. INK COMPOSITIONS

A. Metal Dichalcogenides

In some aspects, the present disclosure provides ink compositions which contain a precursor material for a metal dichalcogenide. These precursor materials may be a compound such as an ammonium metal thiometallate (MS$_4^{2-}$), selenometallate (MSe$_4^{2-}$), or tellurometallate (MTe$_4^{2-}$). These precursor materials may contain a metal which is a transition metal, wherein the transition metal is a metal from Group 3 to Group 12 of the periodic table of the elements. Some specific metals which may be used in these precursor materials include vanadium, niobium, molybium, tantalum, tungsten, or rhenium. In some embodiments, these precursor materials are dissolved or suspended in a solvent. This composition may be further filtered to remove any particles which are greater than 0.2 μm.

These compositions may be deposited on a surface and then heated to a temperature from about 250° C. to about 900° C. or from about 300° C. to about 600° C. The temperature to which the surface has been heated is from about 250° C., 275° C., 300° C., 350° C., 375° C., 400° C., 425° C., 450° C., 475° C., 500° C., 550° C., 600° C., 650° C., 700° C., 800° C., 900° C., to about 1000° C. The compositions may be heated in the presence of hydrogen gas to obtain a metal dichalcogenide.

In some embodiments, the present disclosure provides methods of obtaining a metal dichalcogenide wherein the metal dichalcogenide is a compound of the formula:

$$MX_2 \qquad (I)$$

wherein:
M is a metal ion; and
X is a chalcogenide atom.
In some embodiments, X is a chalcogenide ion selected from S$^{2-}$, Se$^{2-}$, or Te$^{2-}$. In some embodiments, the metal ion is a tetravalent metal ion, especially a tetravalent transition metal ion. The metal ion may be a tetravalent transition metal ion selected from vanadium, niobium, molybium, tantalum, tungsten, or rhenium(IV). One or more non-limiting examples of metal ions including Mo$^{4+}$ or W$^{4+}$.

B. Solvents

In some aspects, the present disclosure relates to ink compositions or the use of ink composition which further comprise a solvent. The preferred solvent is one which does not react with the surface or the materials deposited on the surface. Additionally, the solvents used in the ink composition may be substantially free of blocking agents such as a polymer. In some embodiments, the ink compositions are formulated in water. The water may be filtered such that the solvent does not contain any particles which are greater than 0.2 μm in size.

III. HETEROSTRUCTURES

In some aspects, the present disclosure relates to compositions which contain two ore more different metal dichalcogenides into a higher order structure. These structures may include a pattern of 3D shapes. These patterns may include an array of dots, an array of ribbons or lines, or an array of zig-zag or another meandering shaped lines. These heterostructure may be arranged into a lateral nanostructure assembly comprised of either dots and/or lines. Alternatively, the heterostructure may be arranged into a pattern comprising a vertical structure assembly comprised of either dots and/or lines. Additionally, the heterostructure may be arranged into a pattern comprising a complex geometric shape comprised of dots and/or lines. Some non-limiting examples of patterns which may be formed from the heterostructures described herein include meandering shaped ribbons, checkerboard-like grid, geometric symbols combining rectangles, circles, and other patterns. It is also contemplated that any bitmap image may be imported for rasterization and used to create a pattern which may be imprinted using the compositions and methods described herein.

IV. EXAMPLES

The following examples are included to demonstrate preferred embodiments of the disclosure. It should be appreciated by those of skill in the art that the techniques disclosed in the examples which follow represent techniques discovered by the inventor to function well in the practice of the disclosure, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the disclosure.

Example 1

Methods

A. Preparation of (NH$_4$)$_2$MoS$_4$ Precursor

Ammonium thiomolybdates ((NH$_4$)$_2$MoS$_4$) powder (Alfa Aesar, purity of 99.99%; 0.28 g) was added into 60 mL of deionized (D.I.) water. The obtained precursors were sonicated for 30 min then filtered with 0.2 μm PTFE membranes to get highly dispersed clear solutions. The obtained (NH$_4$)$_2$MoS$_4$ solution was used as ink precursor for the formation of MoS$_2$ structures.

B. Preparation of (NH$_4$)$_2$WS$_4$ Precursor

Ammonium tetrathiotungstate ((NH$_4$)$_2$WS$_4$) powder (Sigma-Aldrich, purity of 99.99%; 0.026 g) was added into 60 mL of D.I. water. The obtained precursors were sonicated for 30 min then filtered with 0.2 μm PTFE membranes to get highly dispersed clear solutions. The obtained (NH$_4$)$_2$WS$_4$ solution was used as ink for the formation of WS$_2$ structures.

The diluted inks with a volume ratio of 1:9 (as-prepared ink:deionized water) was used to produce double layer $WS_2$ ribbon.

C. Direct Write Patterning Process

The patterning of $(NH_4)_2MoS_4$ and $(NH_4)_2WS_4$ precursor inks were performed with a custom made patterning platform with motorized piezo-stages with a resolution of approximately 20 nm for all three XYZ axes. The sample holding stage is also equipped with tilt correction capabilities. The writing tool is essentially a cantilever array of twelve tips with approximately 60 μm inter-tip spacing mounted on the tip holder. The tips and the inkwells with matching pitch were purchased from Advanced Creative Solutions Technology LLC. Si substrates (with 300 nm $SiO_2$ layer) were cleaned by 10 min sonication of acetone, IPA and D.I. water respectively. Cantilevers and substrates were additionally cleaned in Ozone cleaner to render them hydrophilic. Alphabetical markers on $Si/SiO_2$ substrates were deposited via standard e-beam lithography and lift-off process (Pt/Ti metal with thickness of 70 nm/5 nm respectively was used for metallization). Samples with the metalized alphabetical markers were additionally cleaned in the furnace with the mixture of $Ar/H_2$ at 450° C. to remove any possible polymer residuals.

D. Preparation of $MX_2$ Heterostructures

Ribbons of $(NH_4)_2MoS_4$ precursor ink were patterned on cleaned $SiO_2/Si$ substrate and then transferred into CVD system for crystallization of $MoS_2$. The formation of $MoS_2$ was performed in ambient condition, annealed in a mixture of $Ar/H_2$ with the respective flow rates of 400 sccm/100 sccm. The annealing at lower temperatures (~200° C.) can efficiently remove the residual D.I. water. The subsequently higher temperature annealing (~450° C.) orders crystallinity of $MoS_2$. Ribbons of $(NH_4)_2WS_4$ precursor ink were patterned atop of $MoS_2$ ribbons (to form vertical bilayer heterostructures) and adjacent to $MoS_2$ ribbons (to form lateral bilayer heterostructures). The formation of $WS_2/MoS_2$ heterostructures was also performed in ambient condition and annealed in a mixture of $Ar/H_2$ with the respective flow rates of 400 sccm/100 sccm. A slightly lower temperature of 400° C. was used for crystallization of $WS_2$ layer. Same protocol was used for the multi-layered patterned structures. Equations (1) and (2) show the resections in presence of $H_2$ gas.

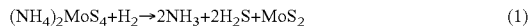
$$(NH_4)_2MoS_4 + H_2 \rightarrow 2NH_3 + 2H_2S + MoS_2 \quad (1)$$

$$(NH_4)_2WS_4 + H_2 \rightarrow 2NH_3 + 2H_2S + WS_2 \quad (2)$$

E. Device Characterization

AFM topographic images were acquired in non-contact mode with a Park NX10 system. Raman spectroscopy was obtained with a Renishaw InVia Raman Spectrometer with the laser excitation wavelength of 532 nm. The Si peak at 520 $cm^{-1}$ was used as reference for wavenumber calibration in all Raman spectral data. A JEOL-2100F system working at 200 kV was employed for the HRTEM microstructure characterization.

Example 2

Deposition of Metal Dichalcogenides

FIG. 1 depicts a schematic overview of the production protocol for creating arrays of $WS_2/MoS_2$ heterostructures. FIG. 1A shows $(NH_4)_2MoS_4$ precursor ink deposited first as an array of ribbons/lines at specific location on $SiO_2/Si$ substrate along y-axis. Subsequently, samples with patterned $(NH_4)_2MoS_4$ precursor structures are processed in the CVD chamber at the required temperature (~450° C.) to form an array of $MoS_2$ ribbons. Next, a different ink precursor $(NH_4)_2WS_4$ is patterned atop of $MoS_2$ ribbons (along x-axis) as shown schematically in FIG. 1B. Once again, samples with $(NH_4)_2WS_4$ patterned precursor structures are subsequently treated in the CVD chamber to complete the formation of the resulting $WS_2/MoS_2$ vertical heterostructures. This direct writing technique also provides a unique way to prepare $WS_2/MoS_2$ lateral heterostructures where the arrays of $(NH_4)_2WS_4$ ink precursor can be easily written in the same direction to align with pre-existing $MoS_2$ structures, (FIG. 1C). Moreover, writing $(NH_4)_2MoS_4$ precursor multiple times as shown in FIG. 1D, will produce $MoS_2/WS_2/MoS_2$ lateral tri-layer heterostructures. These architectures would be challenging to fabricate with conventional lithography and would require multiple additional steps in the fabrication protocol. In contrast, such heterostructures are relatively simple to produce with the use of direct-write scanning probe based nanolithography approach, which effectively offers a nanoscale precision in position and registry with simple mask-free geometry defining capabilities.

The inks developed in this disclosure (($NH_4)_2MoS_4$ and $(NH_4)_2WS_4$ precursors) are water based. Since water is a neutral solvent, it is therefore reasonable to conclude that no chemical reactions occur at room temperature under ambient conditions during the entire writing process. The direct writing technique essentially has two main steps for precursor deposition: "inking" and "writing" as shown in FIG. 2. In the inking step, the tips of an atomic force microscope (AFM) cantilever are dipped into an "ink", and then, the ink is transferred onto the selected substrate during the writing step. Either single or multi-pen cantilevers can be employed. The non-interacting chemical nature of the developed inks allows us to simplify and understand the kinetic model of the writing steps as follows: a) the steps of the ink transferring from tip to substrate with the assistance of water meniscus, b) the ink lateral diffusion on substrate and c) the stopping of diffusion by surface tension of the substrate. The direct writing method as scanning probe based nanolithography can be characterized as a cousin technique to Dip Pen Nanolithography and other related methods (Kuljanishvili et al., 2009, Piner et al., 1999, Wu et al., 2007, Rozhok et al., 2003, Li et al., 2004 and Maynor et al., 2001. In order to obtain large area patterned arrays with high throughput, as required by the semiconductor industry, multi-pen cantilevers had been utilized here for parallel writing. Piezo driven scanners with mounted multi-pen cantilever chip can repeat multiple automated sequences for the production of large area patterns. The use of commercially available custom inkwells with multiple channels enables a convenient solution for improving the patterning efficiency (FIG. 2).

This mask free approach can potentially reduce the amount of residue between the layers of $MoS_2$ and $WS_2$ since no polymer resists were required in the process of writing. An additional advantage of this approach is that there is no need for $MX_2$ materials transfer from growth surfaces to the desirable substrates which has been commonly used and reported in the $MX_2$ heterostructures preparations (Huo et al., 2014, Huo et al., 2015 and Bhimanapati et al., 2015). The solvent chosen for the precursor inks was water, which is normally removed at low annealing temperatures (~200° C.), prior to the formation of $MX_2$ materials (see the discussion of $MoS_2$ and $WS_2$ formation below). Heat-treatment of patterned $(NH_4)_2MoS_4$ and $(NH_4)_2WS_4$ structures with the presence of hydrogen gas ($H_2$) in the CVD furnace has shown to lower the required temperature Alonso et al., (1998) and Brito et al., (1995) at which $MoS_2$ and $WS_2$ crystalline structures are formed (~800° C. to ~450° C.) as described in the equations (1) and (2) in Example 1.

It is possible to generate more complex structures with the combination of two basic patterns, e.g. dots and ribbons/lines using the software protocol sequencing. Arrays of dots were produced by holding the inked cantilever in contact with the substrate so that inks diffuse out in a radial direction to form a circular dot pattern. Then the tip was moved to the next position and the process was repeated as shown in FIG. 3. By controlling the humidity in the working chamber (environmental cell), the tip moving speed and the dwell time, various shapes of $MoS_2$ and $WS_2$ structures (dot arrays and L-shaped ribbons) were fabricated on $SiO_2/Si$ substrates (FIG. 3). Other substrates, for example, single or double layered graphene have also been successfully tested (Dong, et al., 2016, which is incorporated herein by reference).

The fabrication of $MoS_2$ and $WS_2$ ribbons/lines is more challenging as compared to the dot patterns where the AFM tip must continuously move along the sample as shown schematically on the FIG. 1A. Therefore, a dynamic balance needs to be maintained between the ink transfer (from cantilever to substrate), the ink lateral diffusion and stopping of the ink diffusion process in order to modulate the formation of ribbons/lines on a substrate. Although the "writing" of desired ribbons/lines might also be adjusted by modulating the environmental humidity and temperature, all studies of the patterns in this work were performed at a fixed humidity (50%) and temperature (23° C.) for the consistency of the analyses. The writing of $MoS_2$ and $WS_2$ ribbons was studied on $SiO_2/Si$ substrates. Surface of $SiO_2/Si$ substrates is easy to modify and ensures that the key parameters of the ribbons, such as width and thickness, could also be precisely controlled and optimized. Once parameters were optimized for individual ribbons, more complex systems such as $WS_2/MoS_2$ bilayers and $MoS_2/WS_2/MoS_2$ tri-layer heterostructures were created.

Figures 4A, 4B, 4C, 4D:
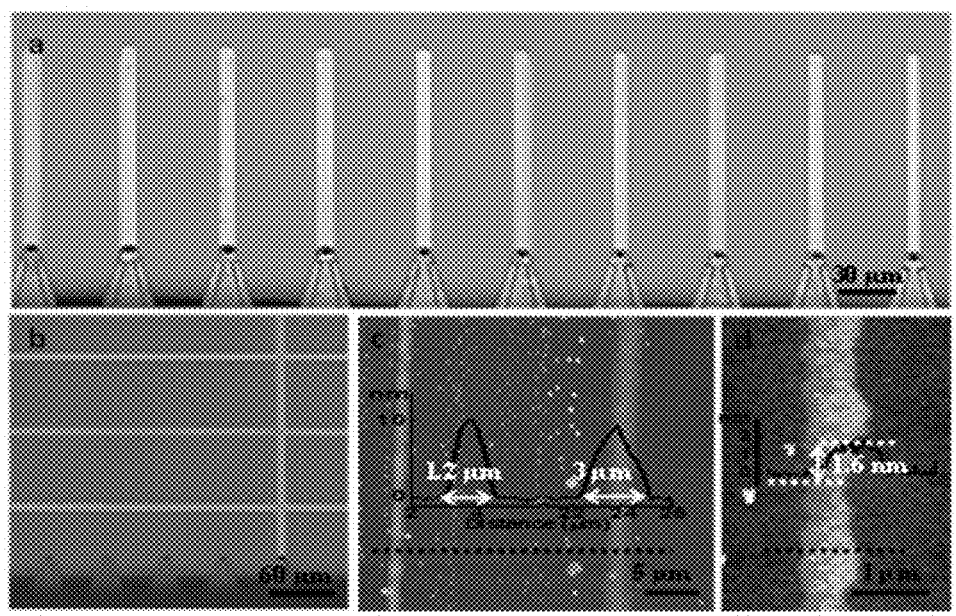
FIGS. 4A-4D shows selectively fabricated $MoS_2$ and $WS_2$ ribbons on $SiO_2/Si$ substrate.

It was established that single and multiple $MX_2$ ribbons with controlled parameters can be fabricated in this direct writing fashion. Multiple parallel ribbons with selected widths and thicknesses were prepared by employing multi-pen cantilever as shown in the optical image (FIG. 4A). In the case where one specific cantilever tip was inked, individual ribbons with fixed width and thickness were written directly at pre-selected locations as shown in FIG. 4B. Due to the fact that the processes of ink transfer (from cantilever to substrate) and diffusing (lateral diffusion on substrate) occur simultaneously when tip is in contact with the substrate, it was found that control of the tip movement speed was the most optimal way to determine the width of the resulting $MoS_2$ and $WS_2$ ribbons. With relatively faster tip speed (in the range of 1-5 μm/s) the process of lateral diffusion of ink on the substrate can be controlled hence narrow ribbons can be obtained. For example, the width of $WS_2$ ribbons were decreased from 3 μm to 1.2 μm when tip moving speed increased from 2 μm/s to 5 μm/s, as shown in the FIG. 4C. However, at significantly slower tip moving speeds such as 0.1 μm/s, the ink meniscus will have more time to diffuse laterally and also produce thicker vertical deposits on the substrate. Table 1 in Example 3 shows the relationship between the tip speed and the width of the $MoS_2$ ribbons.

Higher ink concentration in this disclosure implies the amount of reactant ammonium tetrathiomolybdate $((NH_4)_2MoS_4)$ or ammonium tetrathiotungstate $((NH_4)_2WS_4)$, used for "writing" on the substrate was increased. In order to prepare thinner/thicker structures the amount of reactant was correspondingly decreased/increased by adjusting as-prepared ink concentration, (see more details in Examples 1 and 3). Therefore, to optimize the process it was concluded that the most convenient approach to determine the thicknesses of the resulting $MoS_2$ and $WS_2$ ribbons is to adjust precursor ink composition or concentration and perform the writing at tip speeds in the range between 2 μm/s to 5 μm/s. The influence of ink concentration is clearly observed in the AFM images (FIG. 4D), where double layers $WS_2$ ribbon (~1.6 nm thick and ~0.7 μm wide) was produced by controlling the ink concentration. Table 2 in Example 3 shows the relationship between the ink concentrations and the thicknesses of the $MoS_2$ ribbons.

Figures 5A, 5B, 5C, 5D, 5E, 5F:
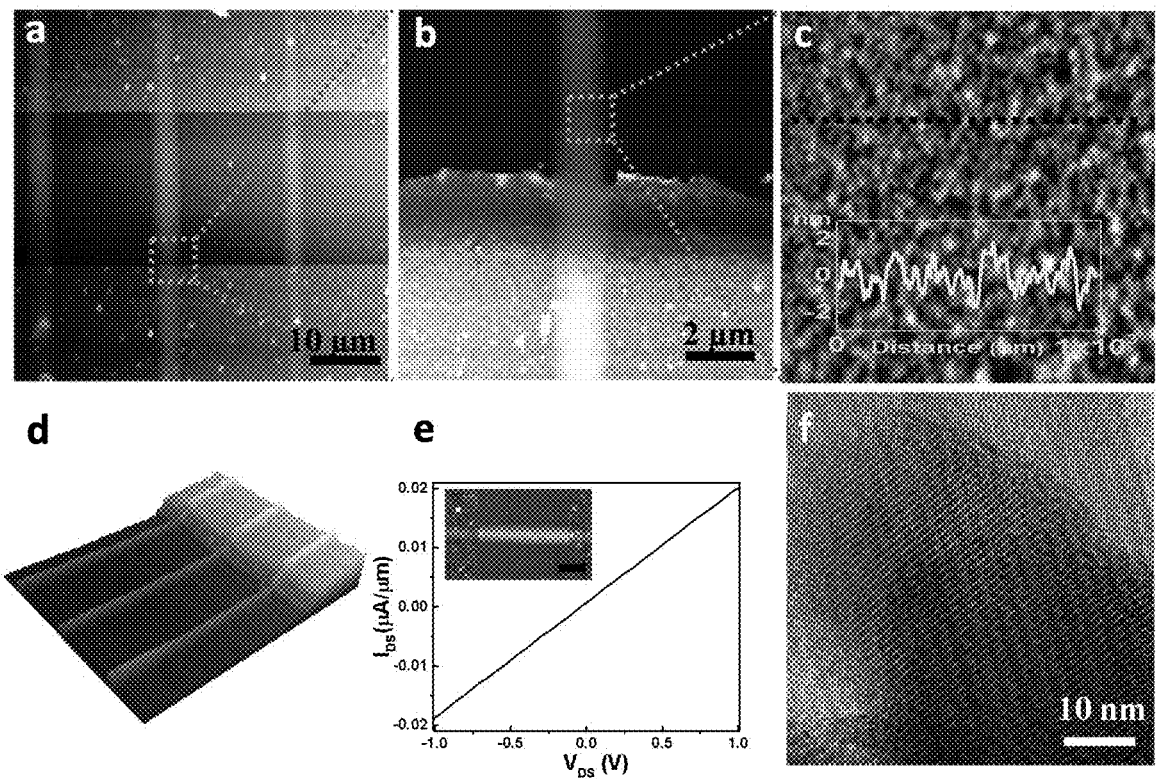
FIGS. 5A-5F show the direct write of $WS_2$ ribbon at predefined locations of the selected substrate.

This direct writing approach provides additional flexibility for precise patterning of $MoS_2$ and $WS_2$ ribbons aligned to prefabricated structures on the substrate. FIG. 5A shows AFM images of the $WS_2$ ribbon structures formed between prefabricated Al/Ti electrodes on $SiO_2/Si$ substrate. The connection between Al/Ti electrodes and $WS_2$ ribbons is continuous and robust and can be observed in the enlarged AFM image (FIG. 5B). An AFM image of the surface of $WS_2$ ribbon is shown in FIG. 5C and the height profile measurement indicates an approximately 1 nm average surface roughness (Inset of FIG. 5C). The three dimensional AFM representation of the same area is shown in FIG. 5D. The robust connection between $WS_2$ and Al/Ti electrode has been further confirmed with the transport measurement at room temperature in vacuum at approximate pressure of $10^4$ Torr. Linear current-voltage behavior was recorded, as shown in FIG. 5E. The resistance described herein is comparable to the devices reported elsewhere, where electrodes are usually deposited on top of the grown $WS_2$ structures (Zhang et al., 2015 and Huo et al., 2014). These results demonstrate that with the proposed bottom-up fabrication method robust connection between $MX_2$ ribbons and prefabricated electrodes is achievable. Moreover, the surface quality of $MX_2$ ribbons is uniform and the surface roughness of ~1 nm is better than typical roughness for the materials derived from the solution based methods. The high-resolution transmission electron microscopy (HRTEM) image in FIG. 5F clearly reveals the periodic atom arrangement of the $MoS_2$ film at a selected location. HRTEM characterization also demonstrates that heat-treatment of patterned $(NH_4)_2MoS_4$ structures with the presence of argon and hydrogen gas atmosphere would indeed lower the required $MoS_2$ crystallization temperature. (More details on the TEM and X-Ray diffraction (XRD) data is shown in Example 3).

Figures 6A, 6B, 6C, 6D, 6E, 6F:
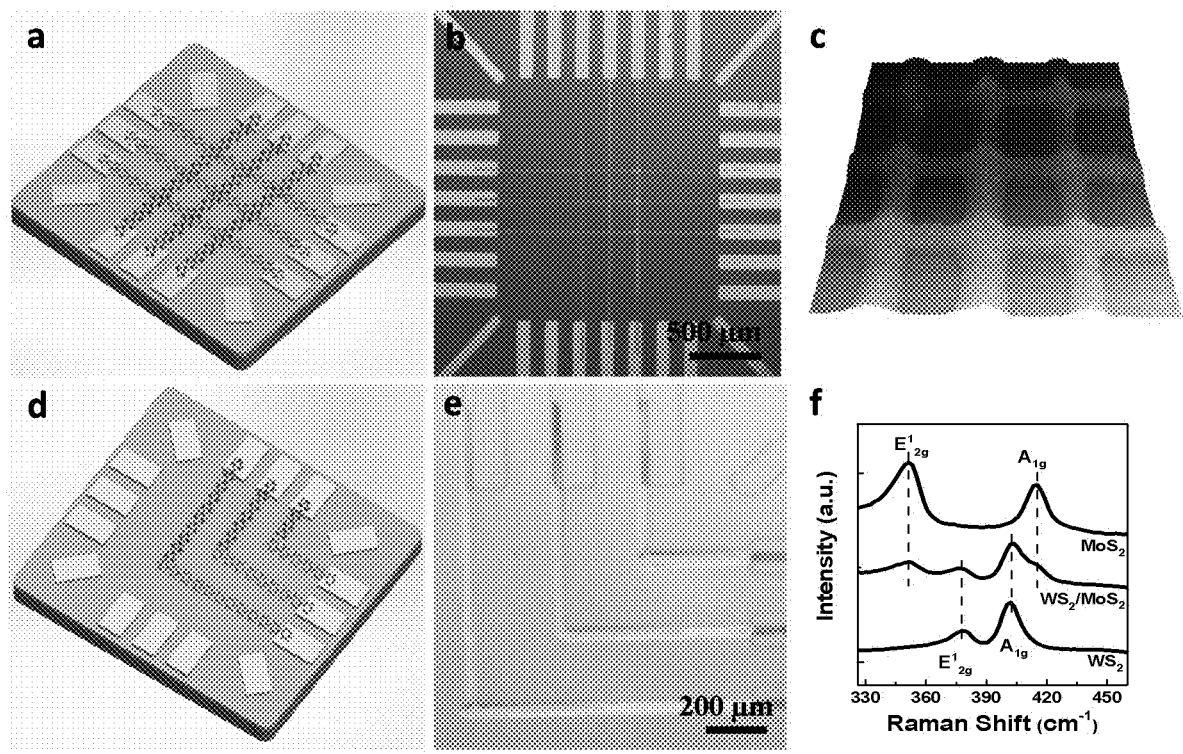
FIGS. 6A-6F shows direct write of various $WS_2/MoS_2$ heterostructures on pre-fabricated devices.

The success in controlled production of $MX_2$ ribbons with specific thickness and width further enables the fabrication of more complex $MX_2$ structures directly on existing devices. The arrays of $WS_2/MoS_2$ heterostructures (in vertical and lateral geometries) have been written at predefined locations between pre-deposited electrodes. As shown in the FIGS. 6A & 6B, nine vertical heterostructure regions of $WS_2/MoS_2$ were prepared by cross-patterning of the arrays of $MoS_2$ ribbons (x-axis direction) and the array of $WS_2$ ribbons (y-axis direction) in the 3×3 arrangement. Representative AFM image (3D view) of the cross-patterned $WS_2/MoS_2$ vertical heterostructures is shown in FIG. 6C, where spacing between heterostructures regions is approximately ~20 μm. (see more details is shown in Example 3 including FIG. 7). In addition, the lateral heterostructures of $WS_2/MoS_2$ were also prepared by connecting patterns of $MoS_2$ ribbons (x-axis direction) with $WS_2$ ribbons (y-axis direction), in 3×3 L-shaped junction arrangement, as shown in the FIGS. 6D & 6E. Furthermore, the data suggest that this method is a versatile methodology and enables the fabrication of more complicated $MX_2$ tri-layer heterostructures, such as $MoS_2/WS_2/MoS_2$ alternating structures directly patterned on prefabricated devices. A representative examples of vertical tri-layer structure of $MoS_2/WS_2/MoS_2$ shown in FIGS. 8A & 8B, and the lateral tri-layer structure of $MoS_2/WS_2/MoS_2$ shown in FIGS. 8C & 8D.

Resonant Raman spectroscopy was also utilized to characterize the fabricated ribbon arrays of $MoS_2$, $WS_2$ and $WS_2/MoS_2$ vertical heterostructures (FIG. 6F). Raman spectra acquired from the pure $MoS_2$ region which exhibited two peaks located at 382 cm$^{-1}$ and 407 cm$^{-1}$, corresponding to $E^1_{2g}$ and $A_{1g}$ modes. Raman spectra from the pure $WS_2$ region show two peaks at 352 cm$^{-1}$ and 419 cm$^{-1}$, also typical signals of $E^1_{2g}$ and $A_{1g}$ modes. The spectra collected at these regions show the characteristic peaks $A_{1g}$ and $E^1_{2g}$ with a wave-number difference of Δ~25 cm$^{-1}$ and Δ~67 cm$^{-1}$ which corresponds to the multilayer values for $MoS_2$ and $WS_2$ as reported previously (Tongay et al., 2014). In contrast, the Raman spectra collected at the vertical heterostructure region show four discrete peaks, which match well to the above $E^1_{2g}$ and $A_{1g}$ modes of multilayer $MoS_2$ and $WS_2$. The relative Raman intensities of $E^1_{2g}$ and $A_{1g}$ modes of $MoS_2$ are maintained without considerable changes before and after the formation of $WS_2$, demonstrating the feasibility for the application of direct write lithography for the production of complex $MX_2$ heterostructures. It was suggested that Raman spectral signatures from vertical heterostructures should not be different from the Raman plots of the lateral ones, although if a strain/stress is present at the lateral heterostructure interface, it may potentially alter Raman spectral characteristics (Chen et al., 2015). One can further improve on the quality (crystallinity) of such polycrystalline materials by increasing the base temperature of the thermal treatment. This is a common approach that could be applied to most polycrystalline systems. The relatively low temperatures were chosen in this study to allow for testing the concept of direct fabrication of precursor inks on metallic devices and even flexible substrates. For example, flexible substrates such as polyimide (Kapton) films and graphene films transferred onto polyamide substrates have been tested. At high temperatures, the thermal treatment of $MX_2$ thin films may induce the sulfur deficiently, which might subsequently degrade their quality. Liu et al. (2012) suggested that introducing sulfur vapor during the thermal treatment (~1000° C.) would significantly improve $MX_2$ material quality.

Example 3

Additional Studies

A. Two-Step Automated Direct-Write Patterning.

Figures 2A, 2B:
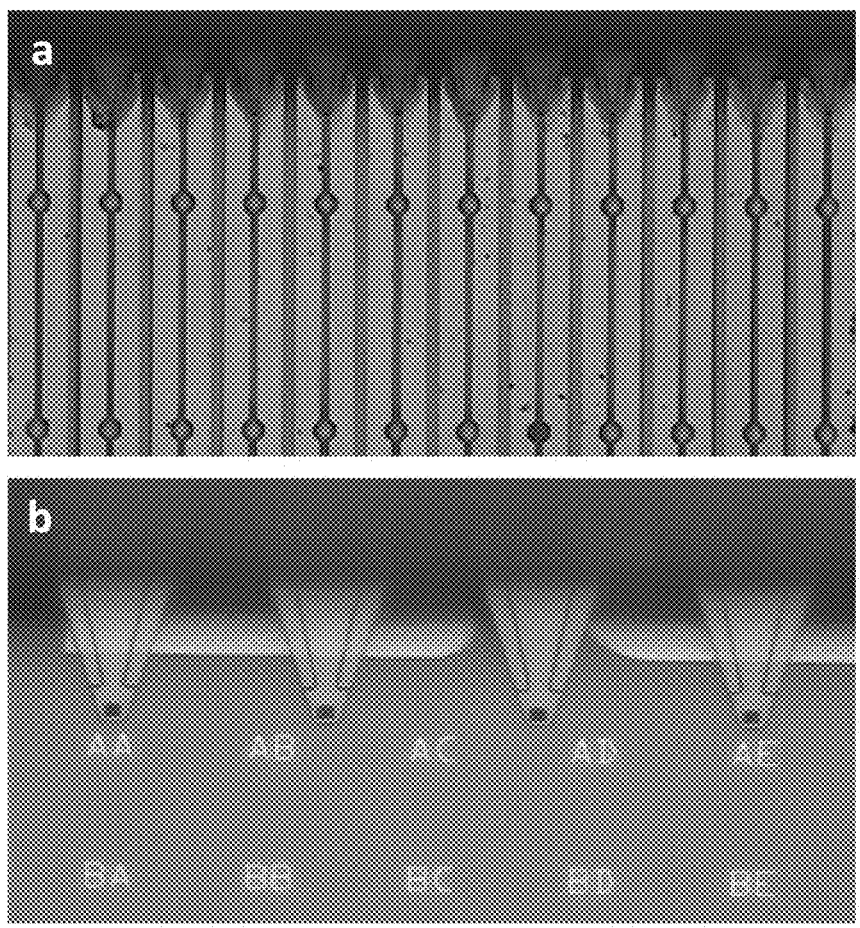
FIGS. 2A & 2B show the schematic view of the patterning process describing two main steps.

The direct write patterning technique employed in this disclosure consists of two main steps, specifically the "inking" and "writing", which can be symbolically described as two steps imitating the handwriting on a paper using a pen or a quill. In direct writing technique the AFM cantilever tips are used as pens. When multi-pen cantilevers are utilized, this allows for parallel writing so that large size arrays of patterns can be obtained with high throughput and efficiency. In the process of inking, the tip of an atomic force microscope (AFM) is dipped into the ink. FIG. 2A, shows the optical image of the inking step. In one example, 12 pen cantilevers and corresponding number of ink reservoir channels, which have a matching pitch to the cantilever tip spacing, can be seen. In the writing step, the selected inks are transferred onto the substrate. FIG. 2B, shows the optical image representing the initial moment of the writing; here tips are shown in contact with the $SiO_2/Si$ substrate. With the assistance of pre-patterned alphabetical markers on the substrates, which are used for alignment and location registry, the inks can be deposited on the selected area of the substrate by utilizing the high precision of the piezo driven motorized stages. Pre-patterned alphabetical markers are made from Pt/Ti metal, (70 nm/5 nm, respectively), via standard e-beam lithography and lift-off process. Substrates then undergo extensive cleaning to remove possible leftover polymer residuals as described in the Example 1.

B. Dot Array Patterns and Other Line Shapes of Fabricated $MX_2$.

Figures 3A, 3B, 3C, 3D:
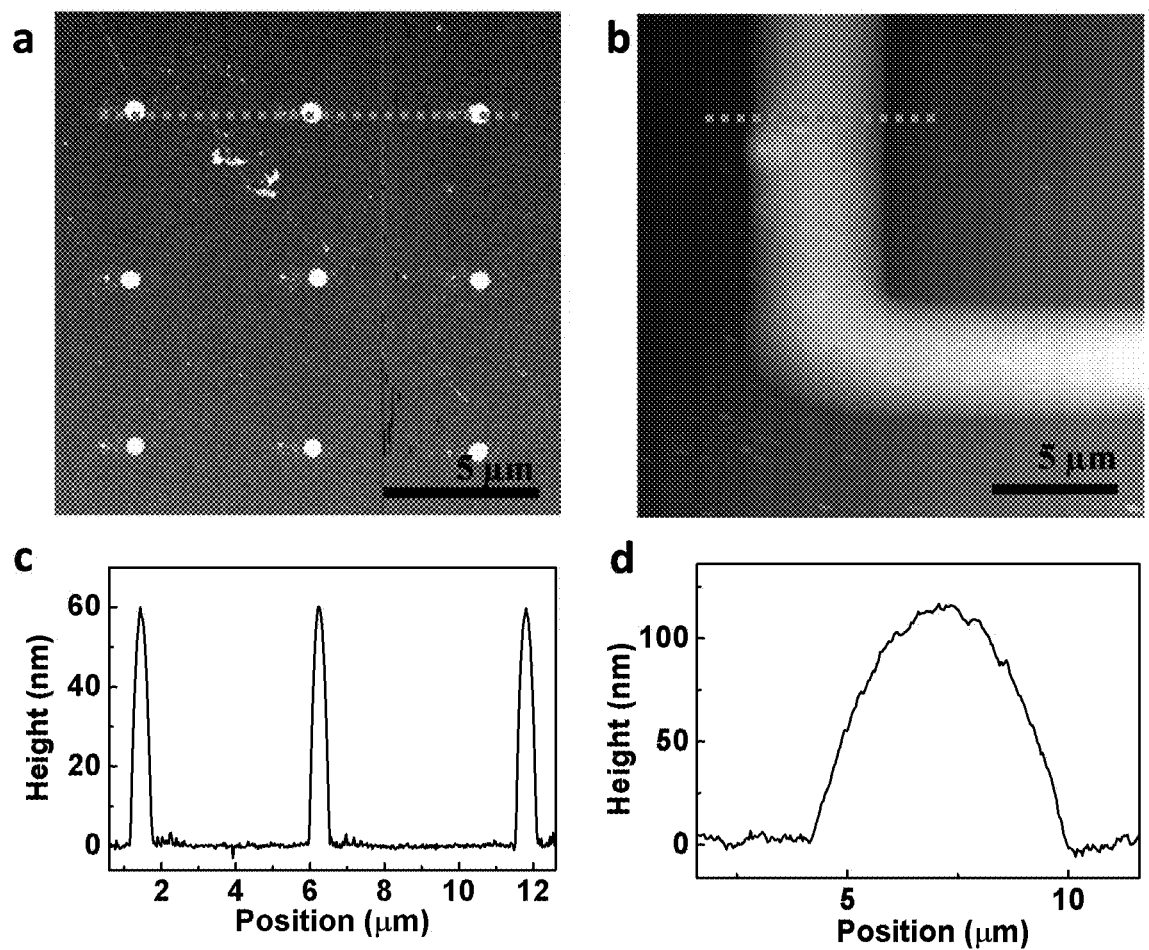
FIGS. 3A-3D shows the examples of $WS_2$ dots structures and L-shaped ribbon patterned on $SiO_2/Si$ substrate.

With direct write fabrication approach complex structures can be potentially prepared with the combination of fabricated arrays of dot and ribbon structures using the software protocol sequencing. Arrays of dots are generally produced by holding the inked cantilever in contact with the substrate to establish the ink transfer from the tips to the substrate which is governed by the diffusion process. This way circular dot (ink droplets) patterns are generated. Then tip retracts and moves to the next position and the process is repeated. By optimizing parameters such as environmental humidity and temperature in the writing chamber, tip moving speed, dwell time and ink concentration the diameter and thickness of $MX_2$ dots can be controlled. FIG. 3A shows an example of 3×3 dot array of $WS_2$ structures on $SiO_2/Si$ substrate. The lateral diameter of $WS_2$ dots can be controlled to achieve the sub-micrometer range. Structures that are shown in the FIG. 3A are approximately 700 nm in diameter, although, thinner and smaller diameter structures could also be realized. The $WS_2$ dot array (3×3) shows uniform height of ~60 nm of each dot as depicted in the AFM height profile measurement (FIG. 3C). Larger ribbons, such as the L-shaped structure shown in AFM topography image (FIG. 4B) with the line profile can also be made easily. FIG. 3D shows approximately 100 nm thick structure with lateral size (line width) is approximately 6 μm. These examples demonstrate that thickness and lateral size of patterned structures can be controlled easily to fit specific application.

C. Patterns of $WS_2/MoS_2$ Heterostructures.

Figures 7A, 7B, 7C, 7D:
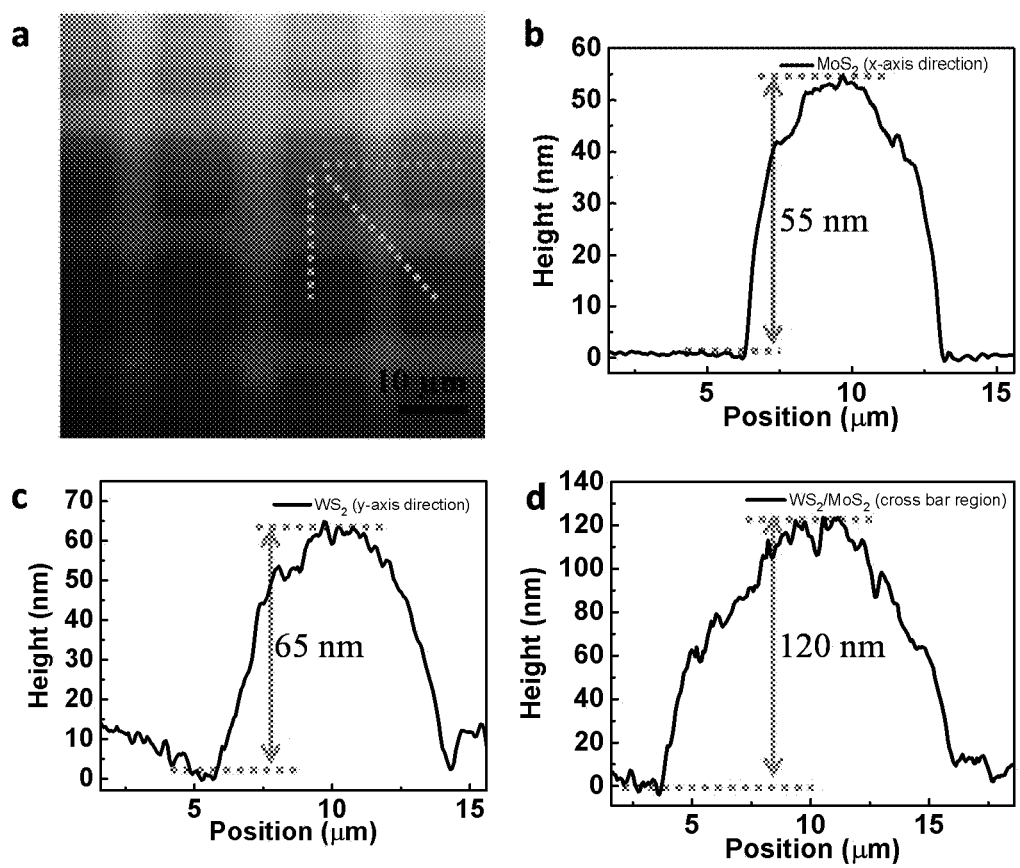
FIGS. 7A-7D show AFM topography image of $WS_2/MoS_2$ heterostructure cross bars (3×3) and corresponding line profiles.

Flexibility of the direct writing approach allows for a convenient way to create variety of architectures, assembled in different configurations. FIG. 7 shows a simple cross bar arrangement of two materials patterned in a two steps process. In the first step, parallel ribbons are written in x-axis directions with $(NH_4)_2MoS_4$ precursor ink and followed by the thermal annealing, as described in Example 1, and in the second step $(NH_4)_2WS_4$ precursor ink is pattered in perpendicular direction (atop of $MoS_2$ ribbons) and also followed by another annealing process to finally form a $WS_2/MoS_2$ heterostructures. AFM topography image (FIG. 7A) and corresponding height profiles of $MoS_2$, $WS_2$ ribbons and $WS_2/MoS_2$ cross bar area are shown in FIGS. 7B, 7C, & 7D, respectively. Regions where two materials are formed on top of each other represent cross-bar regions.

It must be notes that in ribbon writing, (FIGS. 3B & 7A) tips are in continues dynamic interaction with the substrate surface. Because liquid inks were employed in this study, the "dome shaped" profiles were see in the cross-sectional line scans (FIGS. 7B-7D). These shapes are often ascribed to the influence of liquid ink transfer dynamics (Kuljanishvili et al., 2009, Urtizberea et al., 2015 and O'Connell et al., 2014). In this particular example, relatively larger ink loading were used on the tips which was needed for continues writing of long micrometer patterns. A relatively fast ink transfer from the tip to the substrate was used. Substrate surface properties such as hydrophillicity or hydrophobicity could be adjusted to render thinner deposits by influencing the energy dynamics between substrate-ink and ink-intermolecular interactions. Additionally, one can potentially employ alternative solvents, as carrier inks, for delivering the active ingredients, so that the ink transfer and diffusion dynamics can be further tuned to form flatter structures. In the present disclosure, the choice of using water based inks was made because water is a chemically neutral and residue free solvent.

D. Patterns of $MoS_2$/$WS_2$/$MoS_2$ Tri-Layers Structures.

More complicated heterostructures such as $MoS_2$/$WS_2$/$MoS_2$ tri-layer assemblies can also be easily obtained with the direct writing technique. Lateral heterostructures can be formed as easily as vertical heterostructures geometries, owing to the precision of scanning probe nanolithography based approach, such as present technique. This method provides a simple and convenient route for creating complex structures.

The fabrication of tri-layer heterostructures is based on controlled writing of $MX_2$ ribbons in a repeated fashion with subsequent steps of crystallization performed after each patterning step to form final tri-layer architectures. As in earlier examples $(NH_4)_2MoS_4$ and $(NH_4)_2WS_4$ precursor inks were used. The step by step process is described below.

To fabricate vertically assembled tri-layer heterostructure, first a ribbon of $(NH_4)_2MoS_4$ precursor was patterned in horizontal direction (x-axis) for a desired length. Following this step was the annealing of the sample in the CVD furnace to crystallize the precursor to form $MoS_2$ material. Then the sample is placed back into the patterning chamber, aligned with the aid of alphabetical alignment marks and then the diagonal ribbon of $(NH_4)_2WS_4$ precursor is patterned for a desired length. This pattern structure is made in such a way that it overlaps the $MoS_2$ patterned structure. Following this step was the annealing of the sample again in order to crystallize the $(NH_4)_2WS_4$ precursor to form $WS_2$ material. Then once again the sample is placed back into the patterning chamber, aligned to pre-existing pattern, and then, a final ribbon of $(NH_4)_2MoS_4$ precursor in vertical (y-axis) direction is patterned for a desired length. This patterned structure is made in such a way that it overlaps with the other two structures at the desired point. Lastly, annealing is performed to crystallize the $MoS_2$ patterned structure. At the intersection of three ribbons a vertical $MoS_2$/$WS_2$/$MoS_2$ heterostructure is formed.

To create lateral tri-layer heterostructure, a slightly different sequence of patterning steps is performed. First, $(NH_4)_2WS_4$ precursor ink is patterned in diagonal direction as a ribbon of a desired length. This is followed with the annealing process, to crystallize the $WS_2$ ribbon structure. Then, each of the two $(NH_4)_2MoS_4$ precursor patterns is made in such a way that it only touches the diagonal pattern of $WS_2$ on one side. This is the most challenging step in the patterning sequence for creating lateral tri-layer heterostructure, as it is highly dependent on nanoscale precision capabilities of the instrument. The final step of annealing completes the process of lateral tri-layer $MoS_2$/$WS_2$/$MoS_2$ heterostructure formation.

Figures 8A, 8B, 8C, 8D:
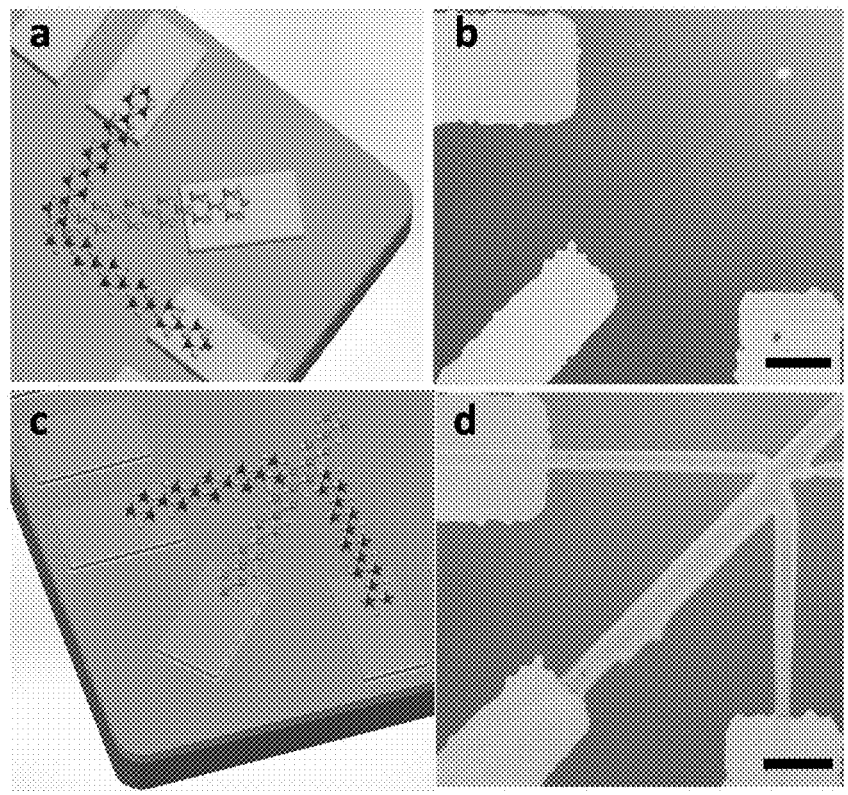
FIGS. 8A-8D show the conceptual representation of $MoS_2/WS_2/MoS_2$ tri-layer heterostructures.

FIG. 8 shows the schematics and representative optical images demonstrating the concept of creating $MoS_2$/$WS_2$/$MoS_2$ tri-layer heterostructures. The schematic representation of the $MoS_2$/$WS_2$/$MoS_2$ tri-layer vertical heterostructures is shown in FIG. 8A. In this representation, it is easy to see that when additional layer of $MoS_2$ ribbon is formed on top of the $WS_2$/$MoS_2$ heterostructures, this effectively creates a tri-layer junction in the region. In this junction all three layers of materials are assembled on top of each other vertically. Optical image (FIG. 8B) shows a tri-layer vertical heterostructure of the $MoS_2$/$WS_2$/$MoS_2$. Similarly, the schematics of $MoS_2$/$WS_2$/$MoS_2$ lateral tri-layer heterostructure and an actual optical image of patterned $MoS_2$/$WS_2$/$MoS_2$ lateral tri-layer is shown in FIG. 8C and FIG. 8D, respectively.

E. Controlling of the $MX_2$ Ribbon Width and Thickness.

In the direct writing of ribbons, the meniscus of water facilitates the continuous writing as tip moves along the surface and ink also self-diffuses in the lateral direction at the same time. With a relatively faster tip speed we show that the process of ink lateral diffusion on the substrate can be controlled so that narrower ribbons are obtained. The relationship between the tip speed and the width of the $MoS_2$ ribbons is presented in detail in Table 1. In these experiments (Table 1), as-prepared ink precursor (ammonium tetrathiomolybdate $((NH_4)_2MoS_4)$) was used. The software capabilities of the patterning tool allow only limited control of the discrete tip speeds which are indicated in the Table 1. The parameters in this table are also suitable for the process to control the width of $WS_2$ ribbon using as prepared ammonium tetrathiotungstate $((NH_4)_2WS_4)$ ink precursor.

TABLE 1

The Relationship Between the Tip Speed and the MoS₂ Ribbon Widths

| Tip moving speed (μm/s) | Ribbon width (μm) |
|---|---|
| 0.1 | 14~18 |
| 1 | 5~6 |
| 2 | 2.7~3.1 |
| 5 | 1.0~1.2 |

It has been also demonstrated that the most convenient approach to determine the thicknesses of the resulting $MoS_2$ and $WS_2$ ribbons is to adjust precursor ink concentration. Table 2 was added to discuss in more detail relationship between controlling parameters such as ink precursor (ammonium tetrathiomolybdate $((NH_4)_2MoS_4)$) concentration and the resulting thicknesses of $MoS_2$ ribbons. The tip moving speed in the measurements in Table 2 was set to 5 μm/s. In order to obtain a stable ink, the compositions were filtered using a PTFE filter and thus the ink concentrations here are indicated as volume ratios of as-prepared ink to D.I. water. The obtained parameters shown in Table 2 are also suitable for the thickness control experiments for $WS_2$ patterned ribbons created with as-prepared ammonium tetrathiotungstate $((NH_4)_2WS_4)$ ink precursor.

TABLE 2

The relationship between the ink concentration and MoS2 ribbon thicknesses.

| Ink concentration (the volume ratio of as-prepared ink:D.I. Water) | Ribbon thickness (nm) |
|---|---|
| 1:0 | 50~60 |
| 1:1 | 20~26 |
| 1:3 | 8~10 |
| 1:9 | 1.5~1.9 |

F. HRTEM and XRD Characterizations.

Figure 9:
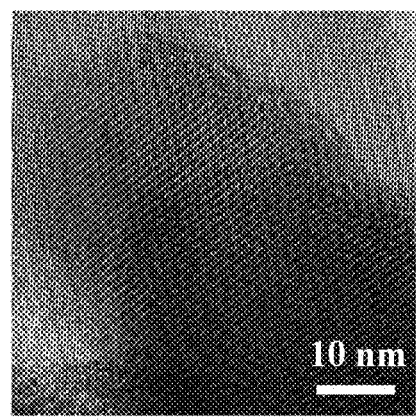
FIG. 9 shows representative high-resolution TEM image depicting $MoS_2$ structure with well-defined atomic arrangement. Samples were prepared with same thermal treatment conditions as described in Example 1.
Figures 10A, 10B:
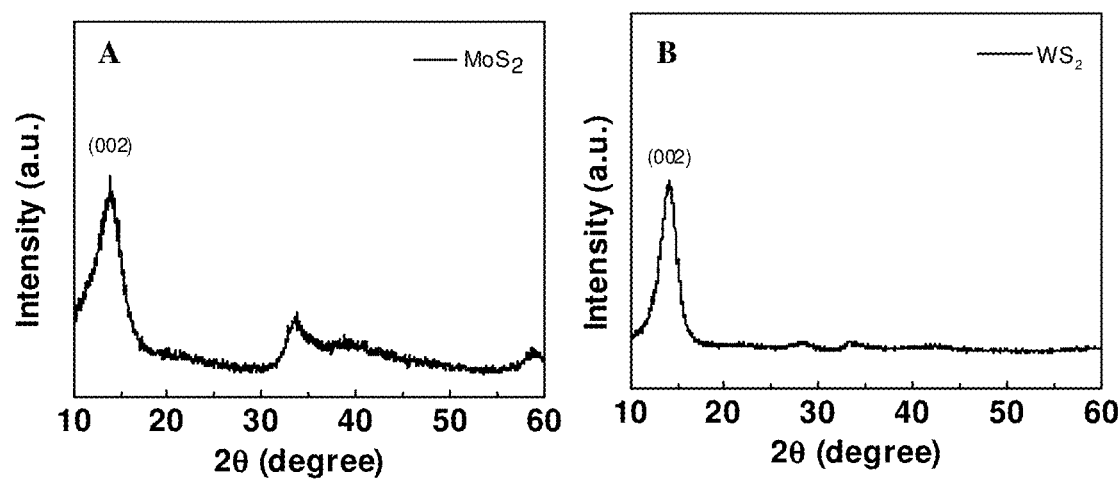
FIGS. 10A & 10B shows the X-ray diffraction pattern of $MoS_2$ film (FIG. 10A) and X-ray diffraction pattern of $WS_2$ film (FIG. 10B). The characteristic peaks at low angles at $2\theta \approx 14.3°$ are present for both materials.

High-resolution transmisson electron microscopy (HR-TEM) was used for imaging the structure of $MoS_2$ material prepared by the thermal treatment of ammonium tetrathiomolybdate (($NH_4$)$_2MoS_4$) as discussed in the Example 1. As shown in FIG. 9, the periodic atomic arrangement of the $MoS_2$ material structure at a selected location can be clearly observed. HRTEM characterization also demonstrates that heat-treatment of patterned ($NH_4$)$_2MoS_4$ structures with the presence of argon and hydrogen gas atmosphere indeed would lower the required $MoS_2$ crystallization temperature as described in the Example 1.

In addition, the presence of $MoS_2$ and $WS_2$ materials can be further demonstrated by the XRD (X-Ray diffraction) measurement. The signal from as-prepared $MX_2$ ribbon seemed too weak for detection using the XRD instrumentation set up (Rigaku XRD MiniFlex 600) which may be partly a result of the material's overall low coverage on the substrate. Additional $MX_2$ samples were prepared for XRD measurement by the dip coating method with exact same inks and thermal treatment procedures as those used for ribbon preparations. In these samples, the typical strong peak at approximately $2\theta \approx 14.3°$ was identified in $MoS_2$ and $WS_2$ samples (Miremadi and Morrison, 1988, Nguyen et al., 2016 and Ramakrishna Matte et al., 2010).

G. Preparation of ($NH_4$)$_6Mo_7O_{24} \cdot 4H_2O$ Precursor

Ammonium molybdate tetrahydrate (($NH_4$)$_6Mo_7O_{24} \cdot 4H_2O$) powder (Sigma-Aldrich, purity of 99%; 40.1 mg) was added into 9 mL of deionized (D.I.) water. The obtained precursors were sonicated for 30 min then filtered with 0.2 μm PTFE membranes to get highly dispersed clear solutions. The obtained ($NH_4$)$_6Mo_7O_{24}$ solution was used as ink precursor for the formation of $MoS_2$ and $MoSe_2$ structures.

H. Preparation of ($NH_4$)$_{10}H_2(W_2O_7)_6$ Precursor

Ammonium tetrathiotungstate (($NH_4$)$_{10}H_2(W_2O_7)_6$) powder (Sigma-Aldrich, purity of 99.99%; 43.6 mg) was added into 9 mL of D.I. water. The obtained precursors were sonicated for 30 min then filtered with 0.2 μm PTFE membranes to get highly dispersed clear solutions. The obtained ($NH_4$)$_{10}H_2(W_2O_7)_6$ solution was used as ink precursor for the formation of $WS_2$ and $WSe_2$ structures.

I. Direct Write Patterning Process

The patterning of ($NH_4$)$_6Mo_7O_{24}$ and ($NH_4$)$_{10}H_2(W_2O_7)_6$ precursor inks were performed with a custom made patterning platform with motorized piezo-stages with a resolution of approximately 20 nm for all three XYZ axes. The sample holding stage is also equipped with tilt correction capabilities. The writing tool is essentially a cantilever array of twelve tips with approximately 60 μm inter-tip spacing mounted on the tip holder. The tips and the inkwells with matching pitch were purchased from Advanced Creative Solutions Technology LLC. Si substrates (with 300 nm $SiO_2$ layer) were cleaned by 10 min sonication of acetone, IPA and D.I. water respectively. Cantilevers and substrates were additionally cleaned in Ozone cleaner to render them hydrophilic. Alphabetical markers on $SiO_2$/Si substrates were deposited via standard e-beam lithography and lift-off process (Pt/Ti metal with thickness of 70 nm/5 nm respectively was used for metallization). Samples with the metalized alphabetical markers were additionally cleaned in the furnace with the mixture of Ar/$H_2$ at 450° C. to remove any possible polymer residuals.

J. Preparation of $MoS_2$ Structure

Ribbons of ($NH_4$)$_6Mo_7O_{24}$ precursor ink were patterned on cleaned $SiO_2$/Si substrate and then transferred into CVD system for crystallization of $MoS_2$. The patterned sample was placed in the middle of the CVD tube, and 10-60 mg of sulfur (Sigma-Aldrich, purity of 99.98%) powder was placed at the upstream. The formation of $MoS_2$ was performed in ambient condition, annealed in Ar with the respective flow rates of 100 sccm. The annealing at lower temperatures (~200° C.) can efficiently remove the residual D.I. water. The subsequently higher temperature annealing (~600° C.) with the sulfur vapor orders crystallinity of $MoS_2$.

K. Preparation of $MoSe_2$ Structure

Ribbons of ($NH_4$)$_6Mo_7O_{24}$ precursor ink were patterned on cleaned $SiO_2$/Si substrate and then transferred into CVD system for crystallization of $MoS_2$. The patterned sample was placed in the middle of the CVD tube, and 10-60 mg of Selenium (Alfa Aesar, purity of 99.5%) powder powder was placed at the upstream. The formation of $MoS_2$ was performed in ambient condition, annealed in Ar with the respective flow rates of 100 sccm. The annealing at lower temperatures (~200° C.) can efficiently remove the residual D.I. water. The subsequently higher temperature annealing (~600° C.) with the sulfur vapor orders crystallinity of $MoS_2$.

L. Preparation of $WS_2$ Structure

Ribbons of ($NH_4$)$_{10}H_2(W_2O_7)_6$ precursor ink were patterned on cleaned $SiO_2$/Si substrate and then transferred into CVD system for crystallization of $WS_2$. The patterned sample was placed in the middle of the CVD tube, and 10-60 mg of sulfur (Sigma-Aldrich, purity of 99.98%) powder was placed at the upstream. The formation of $WS_2$ was performed in ambient condition, annealed in Ar with the respective flow rates of 100 sccm. The annealing at lower temperatures (~200° C.) can efficiently remove the residual D.I. water. The subsequently higher temperature annealing (~600° C.) with the sulfur vapor orders crystallinity of $WS_2$.

M. Preparation of $WSe_2$ Structure

Ribbons of ($NH_4$)$_{10}H_2(W_2O_7)_6$ precursor ink were patterned on cleaned $SiO_2$/Si substrate and then transferred into CVD system for crystallization of $WSe_2$. The patterned sample was placed in the middle of the CVD tube, and 10-60 mg of Selenium (Alfa Aesar, purity of 99.5%) powder was placed at the upstream. The formation of $WSe_2$ was performed in ambient condition, annealed in Ar with the respective flow rates of 100 sccm. The annealing at lower temperatures (~200° C.) can efficiently remove the residual D.I. water. The subsequently higher temperature annealing (~600° C.) with the sulfur vapor orders crystallinity of $WSe_2$.

All of the methods disclosed and claimed herein can be made and executed without undue experimentation in light of the present disclosure. While the compositions and methods of this disclosure have been described in terms of preferred embodiments, it will be apparent to those of skill in the art that variations may be applied to the methods and in the steps or in the sequence of steps of the method described herein without departing from the concept, spirit and scope of the disclosure. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the disclosure as defined by the appended claims.

REFERENCES

The following references, to the extent that they provide exemplary procedural or other details supplementary to those set forth herein, are specifically incorporated herein by reference.

Alonso et al., Catalysis Letters, 52:55-61, 1998.
Bhimanapati et al., ACS Nano, 9:11509-11539, 2015.
Brito et al., Thermochimica Acta, 256:325-338, 1995.
Chen et al., ACS Nano, 9:9868-9876, 2015.
Dong et al., Journal of Physics D: Applied Physics, 47:094001, 2014.
Gong et al., Nat Mater, 13:1135-1142, 2014.
Huo et al., Advanced Functional Materials, 24:7025-7031, 2014.
Huo et al., Journal of Materials Chemistry C, 3:5467-5473, 2015.
Huo et al., Scientific Reports, 4, 5209, 2014.
Jung et al., ACS Nano, 8:9550-9557, 2014.
Kuljanishvili et al., Small, 5:2523-2527, 2009.
Li et al., Chemistry of Materials, 16:1633-1636, 2004.
Liu et al., Nano Letters, 12:1538-1544, 2012.
Maynor et al., Langmuir, 17:2575-2578, 2001.
Miremadi and Morrison, Journal of Applied Physics, 63:4970-4974, 1988.
Nguyen et al., The Journal of Physical Chemistry C, 120: 10078-10085, 2016.
O'Connell et al., Langmuir, 30:2712-2721, 2014.
Piner et al., Science, 283:661-663, 1999.
RadisavljevicB et al., Nat Nano, 6:147-150, 2011.
Ramakrishna Matte et al., Angewandte Chemie International Edition, 49:4059-4062, 2010.
Rozhok et al., The Journal of Physical Chemistry B, 107: 751-757, 2003.
Schwierz et al., Nanoscale, 7:8261-8283, 2015.
Tongay et al., Nano Letters, 14:3185-3190, 2014.
Urtizberea et al., Nanofabrication, 2:43-53, 2015.
Wu et al., Langmuir, 23:9120-9123, 2007.
Yu et al., Nano Letters, 15:486-491, 2015.
Zhang et al., Angewandte Chemie International Edition, 54:8957-8960, 2015.

What is claimed is:

1. A method of preparing a heterostructure comprising:
(A) applying a first ink composition comprising a first metal salt to a substrate;
   wherein the ink composition is further defined as:
      (A) a metal salt of the formula: $X_2ML_2$, wherein:
         X is a monovalent cation;
         M is a transition metal; and
         L is a divalent chalcogen ligand; and
      (B) deionized water;
   wherein the ink composition is substantially free of particles greater than 0.2 μm; or
   an ink composition of the formula:
      (A) a metal salt of the formula: $Y_aZ_b$, wherein:
         Y is a monovalent cation;
         Z is a transition metal oxide of Group 6; and
         a and b are each independently integers sufficient to balance the charge of the transition metal ion of Group 6; and
      (B) deionized water;
   wherein the ink composition is substantially free of particles greater than 0.2 μm and the composition is formulated for use in deposition process
(B) heating the substrate to a first temperature to crystallize the first ink composition to obtain a first metal dichalcogenide;
(C) applying a second ink composition comprising a second metal salt, wherein the second metal salt is different from the first metal salt; and
(D) heating the substrate to a second temperature to crystallize the second ink composition to obtain a second metal dichalcogenide,
   wherein the first ink composition is different from the second ink composition.

2. The method of claim 1, wherein the first ink composition or second ink composition is applied in a pattern.

3. The method of claim 1, wherein the pattern is an array of dots, an array of ribbons or lines, an array of zig-zag or another meandering shaped line or pattern, a lateral nanostructure assemblies of dots and/or ribbons or lines, a vertical structure assemblies made up of dots and/or ribbons or lines, or a complex geometric shape comprises of lines and/or dots.

4. The method of claim 1, wherein the method further comprises applying one or more additional ink compositions to the substrate and heating the substrate to one or more additional temperatures to crystallize the one or more additional ink composition to obtain a one or more additional metal dichalcogenide.

5. The method of claim 1, wherein the first temperature is from about 275° C. to about 1200° C. or the second temperature is from about 275° C. to about 1250° C.

6. The method of claim 1, wherein the substrate is heated at the first temperature or the second temperature in the presence of hydrogen gas.

7. The method of claim 1, wherein the substrate is a silica and/or silicon dioxide surface, a graphene surface, or a silicon nitride, quartz, sapphire, or polyimide surface.

8. The method of claim 1, wherein the ink composition is applied using a pen cantilever.

9. The method of claim 8, wherein the ink composition is applied using a method comprising:
(a) placing the pen of the pen cantilever into the ink composition such that some of the ink composition is transferred to the pen;
(b) placing the pen over the location on the substrate to which the ink composition is to be deposited; and
(c) contacting the ink composition on the pen with the substrate such that at least some of the ink composition on the pen is transferred to the substrate.

10. The method of claim 1, wherein the first metal dichalcogenide forms a feature with a width from about 0.25 μm to about 10 μm or the second metal dichalcogenide forms a feature with a width from about 0.25 μm to about 10 μm.

11. The method of claim 1, wherein the first metal dichalcogenide forms a feature with a thickness from about 0.1 nm to about 1 μm or the second metal dichalcogenide forms a feature with a thickness from about 0.1 nm to about 0.5 μm.

12. An article of manufacture comprising a heterostructure prepared using the methods of claim 1.

13. The method of claim 1, wherein the metal salt is homogenously dispersed in the deionized water.

14. The method of claim 1, wherein X is a quaternary ammonium.

15. The method of claim 1, wherein M is tungsten(VI) or molybdenum(VI).

16. The method of claim 1, wherein L is sulfide or selenide.

17. The method of claim 1, wherein the metal salt is $(NH_4)_2MoS_4$ or $(NH_4)_2WS_4$.

18. The method of claim 1, wherein M is a transition metal oxide of Group 6 is of the formula:

$$(M_1)_x(L_1)_y^{z+}$$

wherein:
$M_1$ is a transition metal of Group 6;
$L_1$ is an oxide ligand;
x is 2, 3, 4, 5, 6, 7, 8, 9, or 10;

y is 3-24; and z is the resultant charge of the formula.

19. The method of claim 1, wherein the metal salt is $(NH_4)_6Mo_7O_{24}$ or $(NH_4)_{10}H_2(W_2O_7)_6$.

\* \* \* \* \*